United States Patent [19]

Genrich

[11] Patent Number: 4,862,016
[45] Date of Patent: Aug. 29, 1989

[54] HIGH SPEED, LOW DRIFT SAMPLE AND HOLD CIRCUIT

[75] Inventor: Thad J. Genrich, Morrison, Colo.

[73] Assignee: Motorola, Inc., Schaumburg, Ill.

[21] Appl. No.: 685,696

[22] Filed: Dec. 24, 1984

[51] Int. Cl.$^4$ .............................................. G11C 27/02
[52] U.S. Cl. ..................................... 307/353; 328/151
[58] Field of Search ............... 307/352, 353, 572, 577; 328/151

[56] References Cited

U.S. PATENT DOCUMENTS

| | | | |
|---|---|---|---|
| 3,390,347 | 6/1968 | Jones et al. | 328/151 |
| 3,516,002 | 6/1970 | Hillis | 328/151 |
| 3,686,577 | 8/1972 | Fruhauf | 307/353 |
| 3,696,305 | 10/1972 | Mitchell et al. | 328/151 |
| 4,209,717 | 6/1980 | Mahony | 307/353 |
| 4,302,689 | 11/1981 | Brodie | 307/353 |

FOREIGN PATENT DOCUMENTS 52-76867  6/1977  Japan .................................. 328/151

OTHER PUBLICATIONS

Signetics Analog, Applications Manual, Jan. 1979, pp. 42-45 & 322-325.
National Linear Applications, vol. I, 1976, pp. An4-3, AN4-4, AN5-8, AN5-10, AN29-6, AN29-7, AN32-1, AN32-6, AN32-7, AN63-7, AN63-8, AN75-3.

Primary Examiner—John Zazworsky
Attorney, Agent, or Firm—Maurice J. Jones; Eugene A. Parsons

[57] ABSTRACT

A sample and hold circuit which achieves both a fast acquisition time and a low droop rate is disclosed. FET or analog switches form a sample switch. When this circuit is in a hold mode the sample switch is biased so that no voltage appears across the switch. However, only one switch or a plurality of switches in parallel connect between a driving buffer and hold capacitor so that a fast acquisition time is achieved when this circuit is in a sample mode.

12 Claims, 1 Drawing Sheet

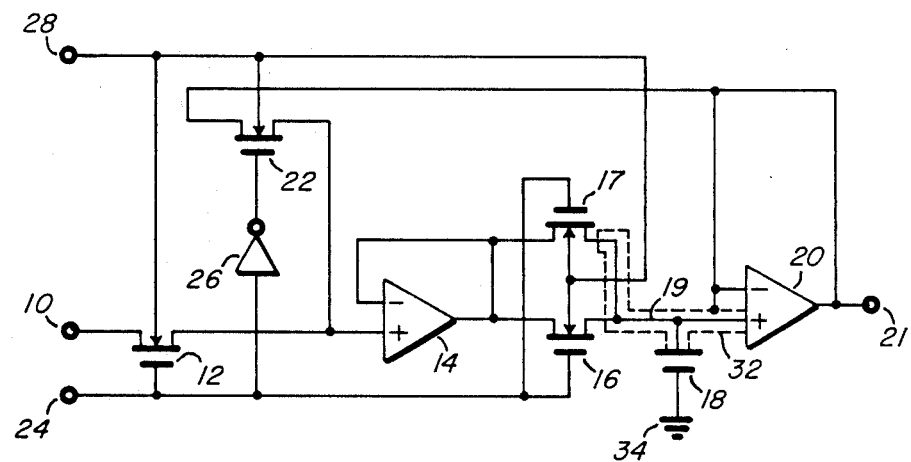

HIGH SPEED, LOW DRIFT SAMPLE AND HOLD CIRCUIT

BACKGROUND OF THE INVENTION

This invention relates generally to sample and hold circuits. Such circuits may also be called sample-hold amplifiers, track/hold amplifiers, or the like. More specifically, the present invention relates to sample and hold (S/H) circuits which exhibit both a fast acquisition time and a low droop rate. The acquisition time parameter may alternatively be called sample time, and the droop rate parameter may alternatively be called a drift rate.

A S/H circuit receives an input signal which typically changes in time. A S/H circuit typically operates in two modes. In a sample mode the S/H circuit acts as an amplifier. Thus, an output signal directly corresponds to the input signal. While in the sampling mode, a hold capacitor within the S/H circuit tracks or acquires a voltage which corresponds to the input signal. In a hold mode the output of the S/H circuit becomes isolated from the input, and the output remains at a voltage level which corresponds to the voltage acquired by the hold capacitor.

Acquisition time and droop rate are two particularly important parameters in S/H circuits. The acquisition time represents the amount of time required for the hold capacitor to accurately charge to a voltage level which corresponds to the input signal. Droop rate refers to the change in the output signal over time when the S/H circuit is in the hold mode. Generally, shorter acquisition times and lower droops are desired.

A representative S/H circuit uses an input buffer which receives the input signal and drives an input to a sample switch. The sample switch has an output which drives the hold capacitor and an input to an output buffer. The output buffer provides the output signal.

Those skilled in the art recognize that various design factors may be considered to improve both acquisition time and droop rate. For example, choosing input buffers having higher slew rates and higher current supplying capabilities, choosing hold capacitors which have smaller values, and allowing imprecise acquisition by the hold capacitor tend to decrease the S/H circuit acquisition time. Likewise, lower droop rates can be obtained by choosing capacitors having lower leakages and higher capacitance values, output buffers having low input bias currents, sample switches with low leakage currents, and using guard bands and compensation capacitors.

Although prior art S/H circuits may exhibit fast acquisition times or low droop rates, they tend to improve one parameter at the expense of degrading other parameters. For example, one technique known to improve droop rate requires the sample switch to have no voltage across it when the S/H circuit is in the hold mode. However, prior art implementations of this technique add an additional switch in series with the sample switch. Thus, on-resistance of the series connected switches increases, resistance in series with the hold capacitor increases, and acquisition time suffers.

Alternatively, fast acquisition time S/H circuits tend to apply a voltage across the sample switch when the S/H circuit is in the hold mode. Thus, sample switch leakage current increases and the resulting droop rate may be higher than is desired.

SUMMARY OF THE INVENTION

Accordingly, it is an object of the present invention to provide an improved S/H circuit which attractively compromises between acquisition time and droop rate. It is believed that the S/H circuit disclosed and claimed herein may be advantageously be used in applications previously believed by those skilled in the art to require a "high speed" S/H circuit or a "low drift rate" S/H circuit. It is further believed that the S/H circuit disclosed and claimed herein may be particularly suited to applications requiring both a short period of time in the sample mode and a long period of time in the hold mode.

Another object of the present invention concerns providing an improved S/H circuit which reduces the resistance in series with a hold capacitor when the S/H circuit is in a sample mode while reducing the voltage across a sample switch while the S/H circuit is in a hold mode.

The above and other objects and advantages of the present invention are carried out in one form by a circuit which contains two operational amplifiers (op amps), each having a signal input and an output, a hold capacitor, and a sample switch having an input and an output. The sample switch may include either only one switch or a plurality of switches coupled in parallel. The output of a first op amp couples to the input of the sample switch, and the ouput of the sample switch couples to the signal input of the second op amp and to the hold capacitor. Both a terminal which receives an input signal and the output of the second op amp couple to the signal input of the first op amp. A signal generated at the output of the first op amp corresponds to the input signal when the circuit is in a sample mode yet corresponds to the signal produced at the output of the second op amp when the circuit is in a hold mode.

BRIEF DESCRIPTION OF THE DRAWINGS

A more complete understanding of the present invention may be derived by reference to the detailed description and claims when considered in connection with the accompanying drawing, wherein the single figure shows a circuit diagram of a preferred embodiment of the present invention.

DETAILED DESCRIPTION OF THE PREFERRED EMBODIMENT

A preferred embodiment of the present invention receives an input signal at a terminal 10, as shown in the figure. Terminal 10 connects to a source node of a FET switch 12. A drain node of switch 12 connects to a non-inverting input of an operational amplifier (op amp) 14 and to a drain node of a FET switch 22. An output of op amp 14 connects to an inverting input of op amp 14. Thus, op amp 14 represents a non-inverting, unity-gain amplifier which serves as an input buffer. The output from op amp 14 also connects to source nodes of FET switches 16 and 17. A drain node of switch 16 connects to a drain node of switch 17, a first node of a hold capacitor 18, and a non-inverting input of an op amp 20 at a circuit node 19. An output from op amp 20 connects to an inverting input of op amp 20. Thus, op amp 20 represents a non-inverting, unity-gain amplifier which serves as an output buffer. The output of op amp 20 also connects to a terminal 21 which supplies the output signal for the present invention, to a guard band 32, and to a source node of switch 22.

A terminal 28 receives a negative potential, and connects to substrates of switches 12, 16, 17, and 22. A terminal 24 receives a mode control input signal and connects to gates of switches 12, 16, and 17, and to an input of an inverter 26. An output of inverter 26 connects to a gate of switch 22. Thus, switches 12 and 22 form a multiplexer which selects either the input signal or the output signal for presentation to the signal input of op amp 14. A terminal 34, which receives a ground or common potential connects to a second node of hold capacitor 18.

The present invention operates in a sample mode and a hold mode. The sample mode occurs whenever a high logic level is presented by the mode control input signal received at terminal 24. A hold mode occurs whenever a low logic level appears on the mode control input signal. For proper operation of switches 12, 16, 17, and 22, the voltages corresponding to logical high and logical low levels of the mode control input signal may advantageously be greater than and less than, respectively, the maximum and minimum anticipated voltage levels, respectively, for the input signal received at terminal 10. Likewise, the negative potential applied at terminal 28 may advantageously be less than the minimum voltage level anticipated for the input signal.

Hold capacitor 18 charges or discharges when the present invention is in the sample mode. In the present embodiment, it is anticipated that hold capacitor 18 will charge or discharge until the voltage appearing across hold capacitor 18 substantially equals the voltage of the input signal. It is desirable that this charging occur as fast as possible. However from the instant the mode control input signal changes to indicate the sample mode, several events must take place before hold capacitor 18 charges or discharges to a voltage which approximates the voltage of the input signal.

An acquisition time parameter of the present invention is a function of these events It represents the minimum time required before the mode control input signal may change logic levels to indicate a hold mode.

First, a propagation delay associated with inverter 26 and a delay involved with changing switch 22 from a closed to an open state must be experienced after the mode control input signal changes to indicate a sample mode. In parallel with this time delay, switch 12 must experience a delay associated with changing from an open state to a closed state. The longer of these two parallel delays must be considered in calculating acquisition time.

A second event which must occur before hold capacitor 18 can acquire the input signal is that the output of op amp 14 must accurately reflect the signal at the noninverting or signal input of op amp 14. The time required for this second event to occur depends upon two parameters associated with op amp 14. One of these two parameters is the current supplying capability of op amp 14. Under worst case conditions, at the instant that switches 16 and 17 close, holding capacitor 18 appears as a short to ground across the output of op amp 14. Accordingly, op amp 14 may current-limit until hold capacitor 18 charges sufficiently to draw less than the maximum current supplying capability from op amp 14. The other parameter associated with op amp 14 concerns its slew rate. After hold capacitor 18 has charged sufficiently to allow op amp 14 to operate at less than maximum current supply, the slew rate of op amp 14 will limit the time required to charge hold capacitor 18.

A third event which must occur before hold capacitor 18 acquires the input signal concerns the RC time constant associated with the on-resistance of switches 16 and 17 and the capacitance of hold capacitor 18. The time required for switches 16 and 17 to change from an open state to a closed state would not be a factor unless this time were significantly longer than the delay associated with switch 12 because it occurs in parallel with that delay. Those skilled in the art recognize that several RC time constants must transpire before hold capacitor 18 can accurately acquire the voltage associated with the input signal. For example, after three RC time constants, hold capacitor 18 will have acquired 95.02 percent of the voltage charge or discharge needed to equal the voltage of a step signal input.

Accordingly, the present invention improves acquisition time by reducing the resistance in series with hold capacitor 18. In the embodiment described above, a sample switch includes switches 16 and 17 connected in parallel. Each of switches 16 and 17 has a characteristic on-resistance associated therewith when the switches are in the closed state. Those skilled in the art recognize that a sample switch including either only one switch (not shown) or a plurality of switches connected in parallel exhibits a lower on-resistance than is exhibited by a plurality of switches connected in series. The lower on-resistance reduces the resistance component of the RC time constant. Thus, the acquisition time of the present invention is reduced.

Implementing the present invention through the use of more desirable components may complement the reduced acquisition time described above. For example, switches 12, 16, 17 and 22 may be N channel enhancement mode FETS because these devices exhibit relatively fast turn on and turn off times and have relatively low on-resistance. If N channel enchancement mode FETS are used, then it is believed that the use of only one of switches 16 and 17, rather than both switches as shown in the figure, provides a sufficiently low on-resistance for most applications. Alternatively, conventional analog switches may be used for switches 12, 16, 17, and 22. If analog switches are used, then it is believed that the present invention may advantageously use both of switches 16 and 17 as shown in the figure. Further, many acceptable switches may not require the substrate connection to terminal 28. Op amp 14 may advantageously exhibit a relatively high short circuit parameter. Additionally, the use of a capacitor having a teflon, polycarbonate, or polyethelene dielectric may advantageously avoid polarization effects which can harm acquisition time.

The present invention enters the hold mode when the mode control input signal changes to a low logic level. Immediately prior to entering the hold mode hold capacitor 18 charges to an acquired voltage as described above in connection with the sample mode. The instant the mode control input signal goes low, switches 12, 16 and 17 change from the closed to the open state. Switch 22 then changes from an open state to a closed state after the delay imposed by inverter 26. Inverter 26 imposes this delay to insure that switch 12 will be in the open state before switch 22 changes to the closed state. This small delay prevents a potential glich from occurring at the signal input to op amp 14 which might disturb the charge on hold capacitor 18.

After switch 22 changes to the closed state, the acquired voltage across hold capacitor 18 appears at the signal input to op amp 14 after being buffered by op amp 20. This acquired voltage then appears at the output of op amp 14. Thus, the acquired voltage appears at both nodes of switches 16 and 17. Since the acquired voltage appears at both nodes of switches 16 and 17, no voltage difference appears across switches 16 and 17, and the leakage current associated with the switches is reduced. For the N channel enhancement mode FETS mentioned above, a mere 10 pa leakage may be anticipated for each of switches 16 and 17. This leakage current is reduced by a factor of 1,000 from the expected leakage current when 10 volts appear across the nodes of the switches.

Accordingly, the present invention improves the droop rate by reducing leakage current across switches 16 and 17. As mentioned above, a sample switch portion of the present invention includes switches 16 and 17 coupled in parallel. Further, the paralleling of switches may be desirable because it reduces the total on-resistance for the sample switch. On the other hand, a competing consideration concerns the leakage current associated with parallel connected switches. The total leakage current for the sample switch increases as switches are connected in parallel, and the droop rate of the circuit increases accordingly. However, it is believed that any increase in leakage current due to the parallel connection of a reasonable number of switches is insignificant so long as no voltage appears across the sample switch when the circuit is in the hold mode as described above.

Other factors, such as the selection of desirable components, may also reduce the droop rate. For example, the preferred embodiment of the present invention utilizes a FET input op amp for op amp 20. A FET input op amp may offer a bias current at the signal input as low as 20 pa. Additionally, low leakage capacitors may be chosen for hold capacitor 18.

Guard band 32 also improves the droop rate. The output from op amp 20 drives guard band 32. Thus, both circuit node 19 and guard band 32 are at the same potential. This minimizes stray leakage currents because no potential differences exist in the vicinity of circuit node 19.

Layout considerations may further improve the droop rate. The wires, traces, or the like, which are involved in connecting circuit node 19 to the various components may advantageously be as short as possible. This also tends to minimize stray leakage current.

A circuit using CA3260 op amps, MC14066 analog switches, a 150 pf hold capacitor, and the teaching contained herein has demonstrated a 0.492 microsecond acquisition time and a 63.5 millisecond hold time.

The foregoing description uses a preferred embodiment to illustrate the present invention. However, those skilled in the art will recognize that changes and modifications may be made in this embodiment without departing from the scope of the present invention. For example, an inverter such as inverter 26 may be implemented in many ways. A transistor where the transistor's base node represents the inverter input and the transistor's collector node represents the inverter output may suffice. Furthermore, the signal inversion and the delay functions performed by inverter 26 may alternatively be provided by the system element which generates the mode control input signal.

The present invention could be modified so that a gain is provided between input terminal 10 and output terminal 21. This might be accomplished by configuring op amps 14 and 20 as non-unity gain amplifiers. However, switch 22 should be coupled to op amp 14 so that the gain of op amp 14 changes as the present invention enters the hold mode. In the hold mode, the gain of operational amplifier 14 should approximate the reciprocal of the gain of op amp 20 so that the net gain from the acquired voltage at hold capacitor 18 through op amp 20, switch 22, and op amp 14 approximates 1, and no voltage appears across switches 16 and 17.

Furthermore, those skilled in the art will recognize that drain and source nodes of FET switches are typically interchangeable. The above and other modifications obvious to those skilled in the art are intended to be included within the scope of this invention.

I claim:

1. A sample and hold circuit having sample and hold modes, said circuit being for responding to an input signal exhibiting a voltage relative to a common potential and for providing an output signal, said circuit comprising:
   a first operation an amplifier having a signal input and an output;
   a second operational amplifier having a signal input and an output, the output from said second operational amplifier producing the output signal;
   a hold capacitor coupled between the signal input of said second operational amplifier and a ground terminal adapted to receive the common potential;
   a sample switch coupled between the output of said first operational amplifier and the signal input of said second operational amplifier, said sample switch including at least one of a predetermined type of switch and having an on-resistance being less than the on-resistance characteristic of two of the predetermined type of switches connected in series;
   an input terminal adapted to receive the input signal, said input terminal and the output of said second operational amplifier being coupled to the signal input of said first operational amplifier so that when the circuit is in the sample mode a signal produced at the output of said first operational amplifier corresponds to the input signal and when the circuit is in the hold mode the signal produced at the output of said first operational amplifier corresponds to the output signal and so that in the hold mode substantially no voltage difference appears across said sample switch.

2. A sample and hold circuit as claimed in claim 1 wherein said first and second operational amplifiers are configured as non-inverting amplifiers.

3. A sample and hold circuit as claimed in claim 1 wherein said first and second operational amplifiers represent unity-gain amplifiers.

4. A sample and hold circuit as claimed in claim 1 wherein said second operational amplifier is a FET input operational amplifier.

5. In combination with a sample and hold circuit of the type wherein a first operational amplifier having an input and an output, a second operational amplifier having an input and an output, and a hold capacitor coupled to the second operational amplifier input are provided for sampling and holding an input signal, wherein an improvement comprises:
   a sample switch coupled between the first operational amplifier output and the second operational amplifier input, said sample switch including at least one of a predetermined type of switch and having an on-resistance being less than the on-resistance characteristic of two of the predetermined type of switches connected in series; and a multiplexer having a first input being responsive to the input signal, having a second input coupled to the second operational amplifier output, and having an output coupled to the first operational amplifier input.

6. A sample and hold circuit for responding to an input signal exhibiting a voltage relative to a common potential, said circuit comprising:

a first switch having a first node adapted to receive the input signal and having a second node;

a first operational amplifier having a signal input coupled to the second node of said first switch and having an output;

a second switch having a first node coupled to the output of said first operational amplifier and having a second node;

a hold capacitor coupled between the second node of said second switch and a terminal adapted to receive the common potential;

a second operational amplifier having a signal input coupled to the second node of said second switch and having an output; and a third switch having a first node coupled to the output of said second operational amplifier and having a second node coupled to the signal input of said first operational amplifier.

7. A sample and hold circuit as claimed in claim 6 wherein said first, second, and :third switches each have a control input in addition to first and second nodes.

8. A sample and hold circuit as claimed in claim 7 wherein said second switch is a N channel enhancement mode FET switch.

9. A sample and hold circuit as claimed in claim 7 wherein the control input of said first switch is coupled to the control input of said second switch.

10. A sample and hold circuit as claimed in claim 9 additionally comprising an inverter having an input coupled to the control input of one of said first and third switches and having an output coupled to the control input of the other of said first and third switches.

11. A method of sampling and holding an input signal, the holding occurring during a hold mode, the sampling and holding being accomplished in a sample and hold circuit having a sample switch with input and output nodes and a hold capacitor coupled to the sample switch output node, said method comprising the steps of:

buffering a voltage present on the hold capacitor to provide an output signal and reduce current drain on the hold capacitor;

buffering an intermediate signal immediately before applying the intermediate signal to the sample switch input node to reduce resistance in series with the hold capacitor; and multiplexing between the input signal and the output signal to provide the intermediate signal so that when the sample and hold circuit is in the hold mode the input node of the sample switches experiences a voltage substantially equivalent to the voltage present on the hold capacitor.

12. A sample and hold circuit for responding to an input signal exhibiting a voltage relative to a common potential, said circuit comprising:

a first switch having a first node adapted to receive the input signal and having a second node and a control input;

a first operational amplifier configured as a non-inverting, unity-gain amplifier, said first operational amplifier having a signal input coupled to the second node of said first switch and having an output;

a second switch having a first node coupled to the output of said first operational amplifier, having a control input coupled to the control input of said first switch, and having a second node;

a hold capacitor coupled between the second node of said second switch and a terminal adapted to receive the common potential;

a FET-input operational amplifier configured as a non-inverting, unity-gain amplifier, said FET input operation amplifier having a signal input coupled to the second node of said second switch and having an output;

a third switch having a first node coupled to the output of said FET-input operational amplifier, having a second node coupled to the signal input of said first operational amplifier, and having a control input; and an inverter having an input coupled to the control input of said first switch and having an output coupled to the control input of said third switch.

* * * * *

UNITED STATES PATENT AND TRADEMARK OFFICE
CERTIFICATE OF CORRECTION

PATENT NO. : 4,862,016

DATED : August 29, 1989

INVENTOR(S) : Thad J. Genrich

It is certified that error appears in the above-identified patent and that said Letters Patent is hereby corrected as shown below:

In column 6, claim 1, line 20, the word "operation" should be changed to --operational--.

In column 8, claim 11, line 13, the word "switches" should be changed to --switch--.

Signed and Sealed this

Twenty-eighth Day of August, 1990

*Attest:*

HARRY F. MANBECK, JR.

*Attesting Officer*     *Commissioner of Patents and Trademarks*